United States Patent [19]
Harvey et al.

[11] Patent Number: 5,976,987
[45] Date of Patent: Nov. 2, 1999

[54] IN-SITU CORNER ROUNDING DURING OXIDE ETCH FOR IMPROVED PLUG FILL

[75] Inventors: Ian Robert Harvey, Livermore; Calvin Todd Gabriel, Cupertino; Subhas Bothra, San Jose, all of Calif.

[73] Assignee: VLSI Technology, Inc., San Jose, Calif.

[21] Appl. No.: 08/943,839

[22] Filed: Oct. 3, 1997

[51] Int. Cl.$^6$ .................................................. H01L 21/00
[52] U.S. Cl. ...................... 438/734; 438/723; 438/724; 438/738; 438/743; 438/744
[58] Field of Search .................... 438/692, 713, 438/714, 717, 723, 724, 725, 734, 736, 738, 743, 744, 637, 672, 638; 216/67, 38, 79; 257/773, 774, 752

[56] References Cited

U.S. PATENT DOCUMENTS

| | | | |
|---|---|---|---|
| 4,543,707 | 10/1985 | Ito et al. | 438/743 X |
| 4,631,248 | 12/1986 | Pasch | 438/713 |
| 4,645,562 | 2/1987 | Liao et al. | 438/713 X |
| 4,807,016 | 2/1989 | Douglas | 438/723 X |
| 4,978,419 | 12/1990 | Nanda et al. | 438/724 X |
| 5,366,590 | 11/1994 | Kadomura | 438/723 |
| 5,841,196 | 11/1998 | Gupta et al. | 438/734 X |
| 5,843,846 | 12/1998 | Nguyen et al. | 438/734 X |

*Primary Examiner*—William Powell
*Attorney, Agent, or Firm*—Wagner, Murabito & Hao

[57] ABSTRACT

A self-aligned contact etch and method for forming a self-aligned contact etch. In one embodiment, the present invention performs an oxide selective etch to form an opening originating at a top surface of a photoresist layer. The opening extends through an underlying oxide layer, and terminates at a top surface of a nitride layer which underlies the oxide layer. Next, the present invention performs a nitride selective etch to extend the opening through the nitride layer to an underlying contact layer. In the present invention, the nitride selective etch causes the photoresist layer to be etched/receded. The nitride selective etch of the present invention further causes the oxide layer to be etched at and near the opening at the interface between the photoresist layer and the oxide layer. As a result, the opening is rounded at the top edge thereof when the layer of photoresist is removed.

15 Claims, 7 Drawing Sheets

IN-SITU CORNER ROUNDING DURING OXIDE ETCH FOR IMPROVED PLUG FILL

TECHNICAL FIELD

The present claimed invention relates to the field of semiconductor devices. More specifically, the present claimed invention relates to the formation of semiconductor devices.

BACKGROUND ART

During the formation of semiconductor devices, it is often necessary to electrically couple layers which are vertically arranged. That is, it is often necessary to electrically couple features on one layer to features on an underlying or an overlying layer. In order to accomplish such a task, an opening is typically formed extending through the vertically arranged layers. The contact opening is then filled with a conductive material so as to form a conductive path extending between the vertically arranged layers.

Prior Art FIG. 1A shows a side sectional view of a step during a conventional contact etch formation method. In Prior Art FIG. 1A, a substrate, not shown, has a nitride layer 100 disposed thereover. An oxide layer 102 is disposed overlying the nitride layer 100. A photoresist layer 104 is disposed above oxide layer 102. In the conventional contact opening formation step illustrated in Prior Art FIG. 1A, photoresist layer 104 has been patterned to remove the photoresist from area 106. An opening (i.e. a portion of a contact opening) has then been formed extending through oxide layer 102 to the top surface of nitride layer 100.

Referring now to Prior Art FIG. 1B, after the formation of the opening extending to the top surface of nitride layer 100, nitride layer 100 is etched away to provide a contact opening at area 106. As shown in Prior Art FIG. 1B, the contact opening extends completely through both oxide layer 102 and nitride layer 100. In such an example, the formation of the contact opening is sometimes used in conjunction with a self-aligned contact etch.

As shown in Prior Art FIG. 1C, such a conventional contact opening formation method then removes the photoresist layer 104 of Prior Art FIGS. 1A and 1B. However, such a conventional contact opening does not have an ideal profile for subsequent semiconductor processing steps. Specifically, in such a conventional contact opening formation method, the upper edge of the contact opening is a sharp corner. For example, regions 108a and 108b of the contact opening are sharp corners. Such a profile induces preferential deposition of metal near the top of the contact during PVD processing. This cusping at the top of the contact results in inadequate filling at the bottom or void formation which reduces electrical performance and reliability of manufactured semiconductor devices.

Thus, a need exists for a method for forming a contact opening wherein the method provides for selective etching of a desired material. A further need exists for a method for forming a contact opening wherein the method does not required substantial deviation from existing semiconductor manufacturing steps and processes. Still another need exists for a method for forming a contact opening wherein the upper edge of the contact opening is beneficially shaped for subsequent processing.

DISCLOSURE OF THE INVENTION

The present invention provides a method for forming a contact opening wherein the method provides for selective etching of a desired material. The present invention further provides a method for forming a contact opening wherein the method does not required substantial deviation from existing semiconductor manufacturing steps and processes. Additionally, the present invention provides a method for forming a contact opening wherein the contact opening is ideally shaped for subsequent processing.

Specifically, in one embodiment, the present invention performs an oxide selective etch to form an opening originating at a top surface of a photoresist layer. The opening extends through an underlying oxide layer, and terminates at a top surface of a nitride layer which underlies the oxide layer. Next, the present invention performs a nitride selective etch to extend the opening through the nitride layer to an underlying contact layer. In the present invention, the nitride selective etch causes the photoresist layer to be etched. The nitride selective etch of the present invention further causes the oxide layer to be etched at and near the opening at the interface between the photoresist layer and the oxide layer. As a result, the opening is rounded at the top edge thereof when the photoresist layer is removed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
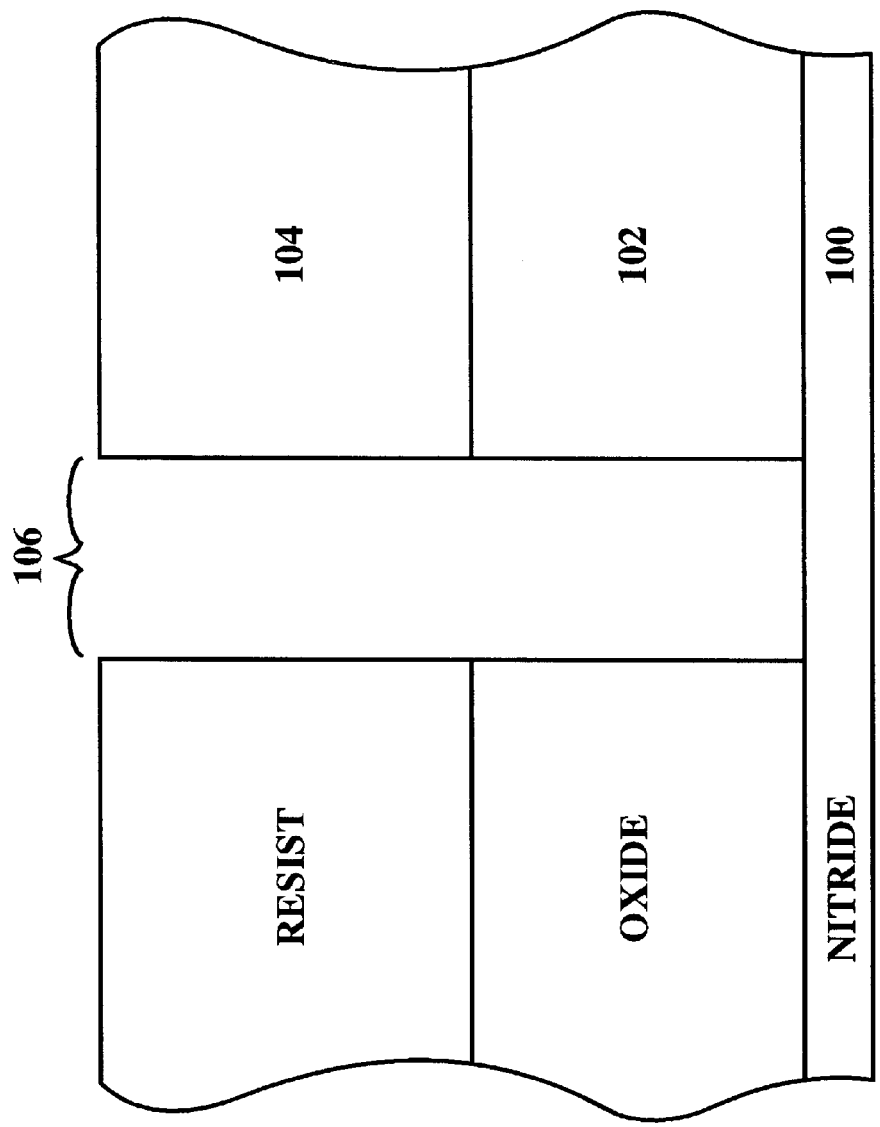
FIG. 1A is a cross-sectional view illustrating a first step associated with a prior art contact opening etch process.
Figure 1B:
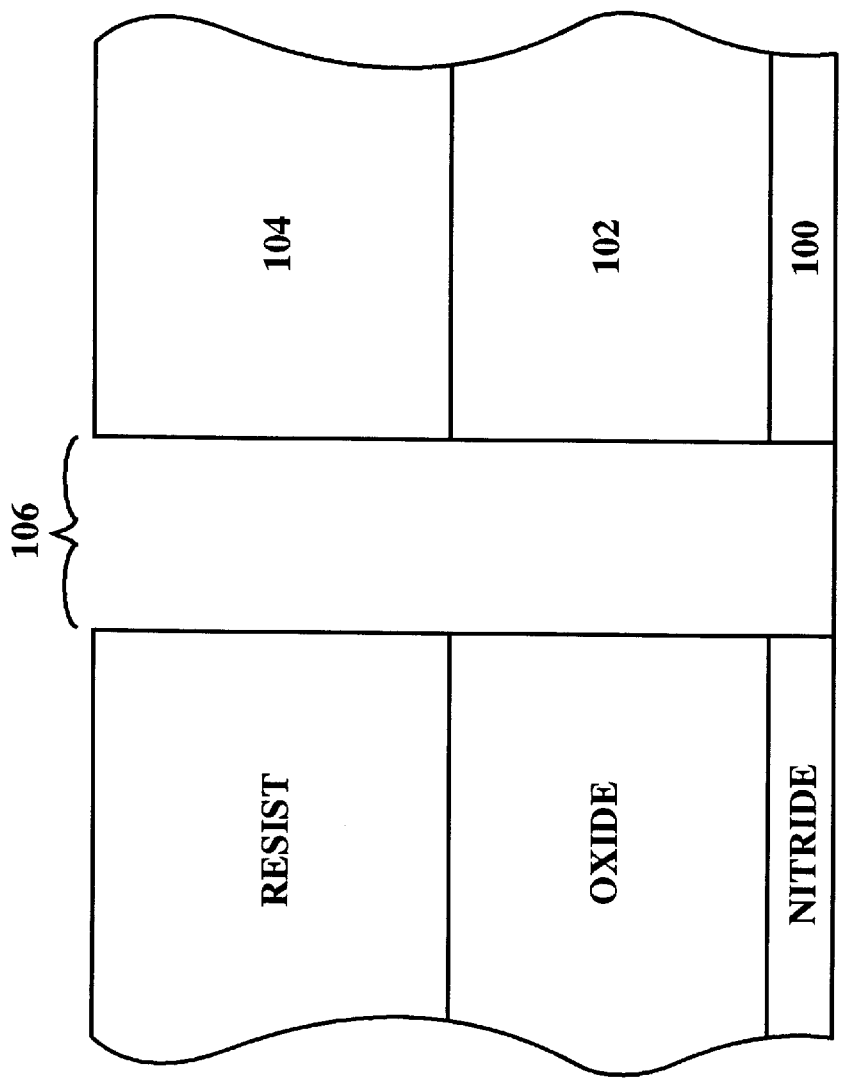
FIG. 1B is a cross-sectional view illustrating a second step associated with a prior art contact opening etch process.
Figure 1C:
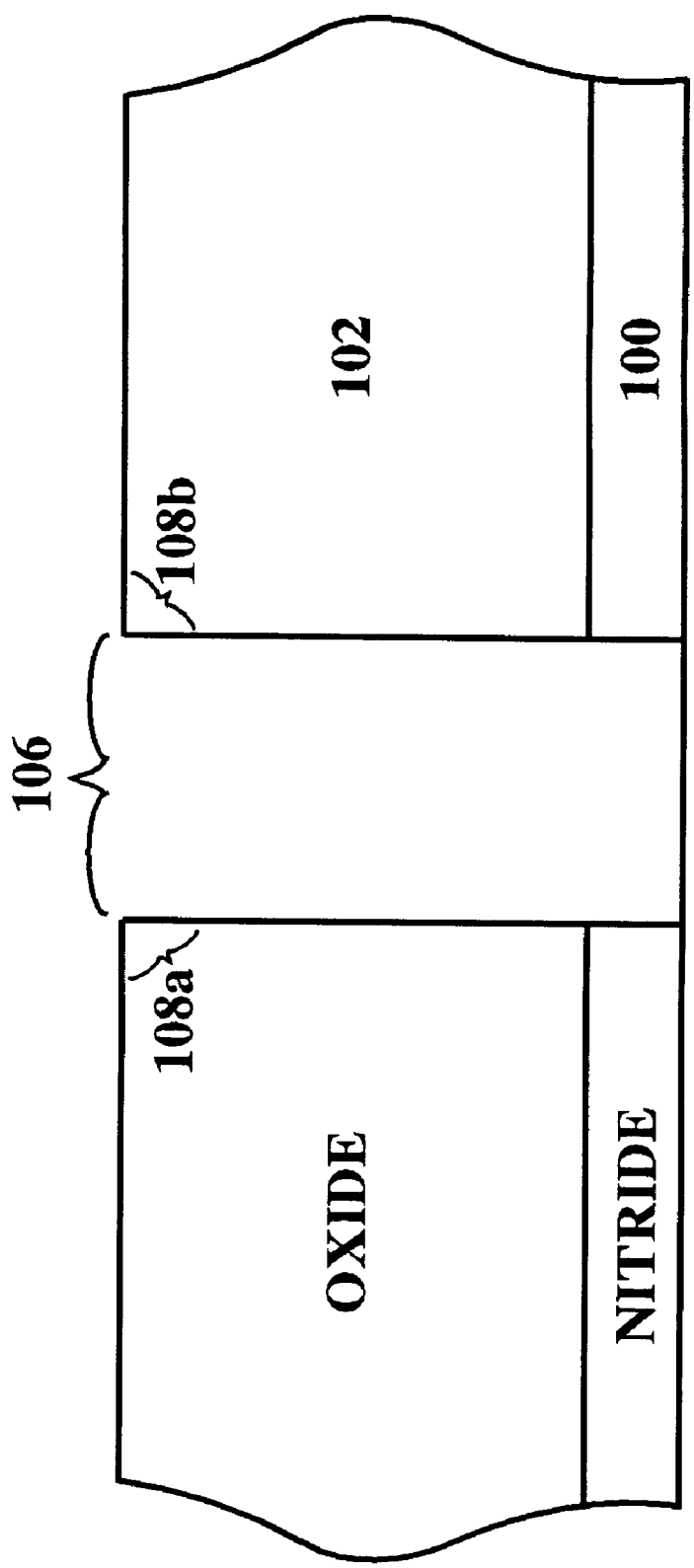
FIG. 1C is a cross-sectional view illustrating a third step associated with a prior art contact opening etch process.
Figure 2A:
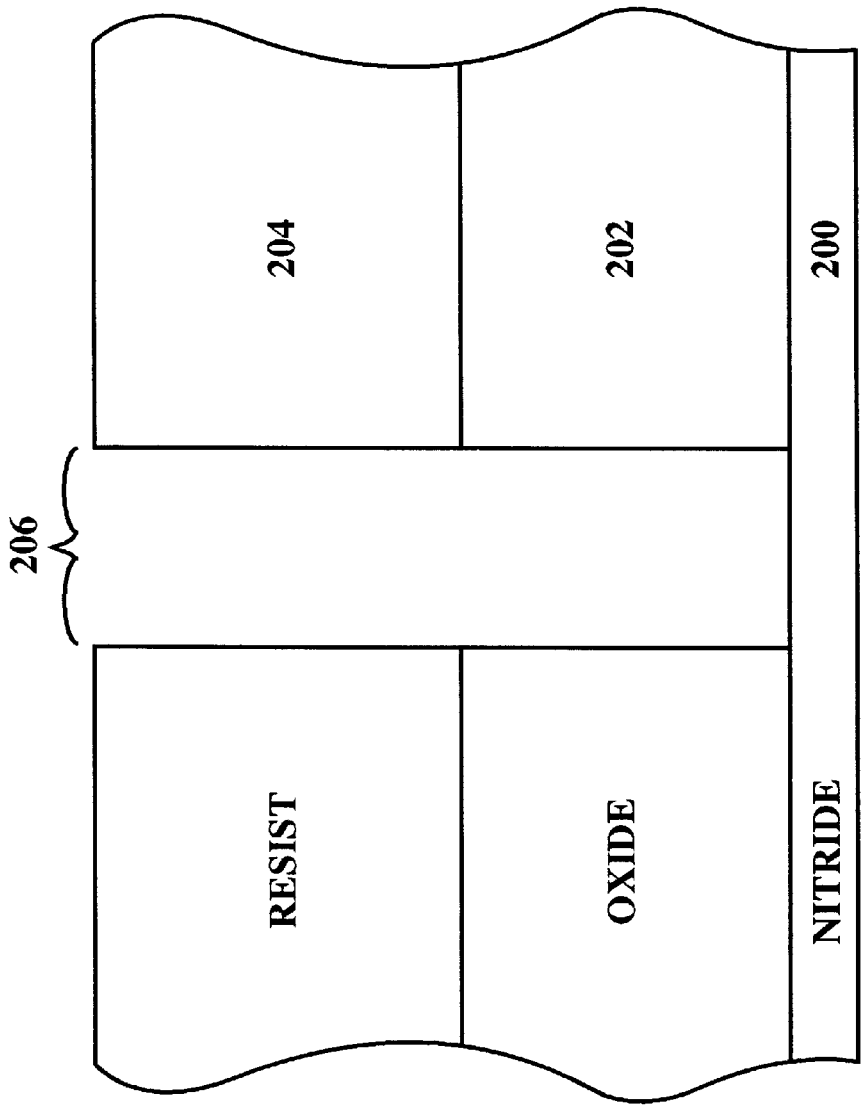
FIG. 2A is a cross-sectional view illustrating a first step associated with the formation of a contact opening having a smoothly rounded upper edge in accordance with the present claimed invention.

The following discussion will pertain to cross-sectional views of a semiconductor device isolating structure in various states of fabrication. With reference now to FIG. 2A, side sectional view of a step used in the formation of a contact opening in accordance with the present claimed invention is shown. In FIG. 2A, a substrate, not shown, has a nitride layer 200 disposed thereover. An oxide layer 202, having a thickness of approximately 9000 angstroms, is disposed overlying nitride layer 200. A photoresist layer 204, having a thickness of approximately 8000 angstroms, is disposed above oxide layer 202. Although such specific thicknesses are recited in the present embodiment, the present invention is well suited to use with various other oxide and photoresist thicknesses.

In the embodiment of FIG. 2A, photoresist layer 204 has been patterned to remove the photoresist from area 206. In the present embodiment, nitride layer 200 is comprised, for example, of silicon nitride having any of various stoichiometries (e.g. $Si_xN_y$). Nitride layer 200 is adapted to be disposed over, for example, a metal silicide which, in turn, is disposed over, for example, a polysilicon gate, or the source region and/or drain region of a semiconductor device. Additionally, in the present embodiment, oxide layer 202 is comprised of, for example, silicon dioxide. Although such a specific oxide layer is recited as overlying nitride layer 200, and a specific material is recited as underlying nitride layer 200 in the present embodiment, it will be understood that the present invention is well suited to use with various other types of oxide materials and nitride-underlying materials.

Referring still to FIG. 2A, the present invention forms an opening (i.e. creates the initial portion of a contact opening) extending through oxide layer 202 and stopping at the top surface of nitride layer 200. In the present embodiment, an etching environment/etch chemistry is selected which etches through the oxide without substantially etching nitride or photoresist. That is, in the present embodiment, the initial opening is formed through oxide layer 202 using an oxide selective etch. In the present embodiment, the present invention achieves an oxide-to-nitride selectivity of approximately 100 to 1, and an oxide-to-photoresist selectivity of approximately 15 to 1. More specifically, the present invention utilizes a gas chemistry comprising approximately 300 standard cubic centimeters per minute (sccm) of Ar, approximately 2 sccm of $CF_4$, approximately 150 sccm of CO, approximately 2 sccm of $C_4F_8$, and approximately 15 sccm of He. Although such specific gas flow rates and ratios are recited in the present embodiment, the present invention is well suited to varying these flow rates/ratios as long as the oxide selective conditions of the present invention remain in effect.

Referring still to FIG. 2A, in the present embodiment, the etch environment has wafer area pressure of approximately 200 mTorr, a chamber pressure of approximately 60 mTorr, a top electrode power of approximately 800 Watts (@ 27 MHz), a bottom electrode power of approximately 1000 Watts (@ 2 MHz), a top electrode temperature of approximately 40 degrees Celsius, a bottom electrode temperature of approximately 40 degrees Celsius, and a wafer-to-top electrode gap of approximately 1.33 centimeters. Although such specific etching environment parameters are recited in the present embodiment, the present invention is well suited to varying these parameters as long as the oxide selective conditions of the present invention remain in effect.

Figure 2B:
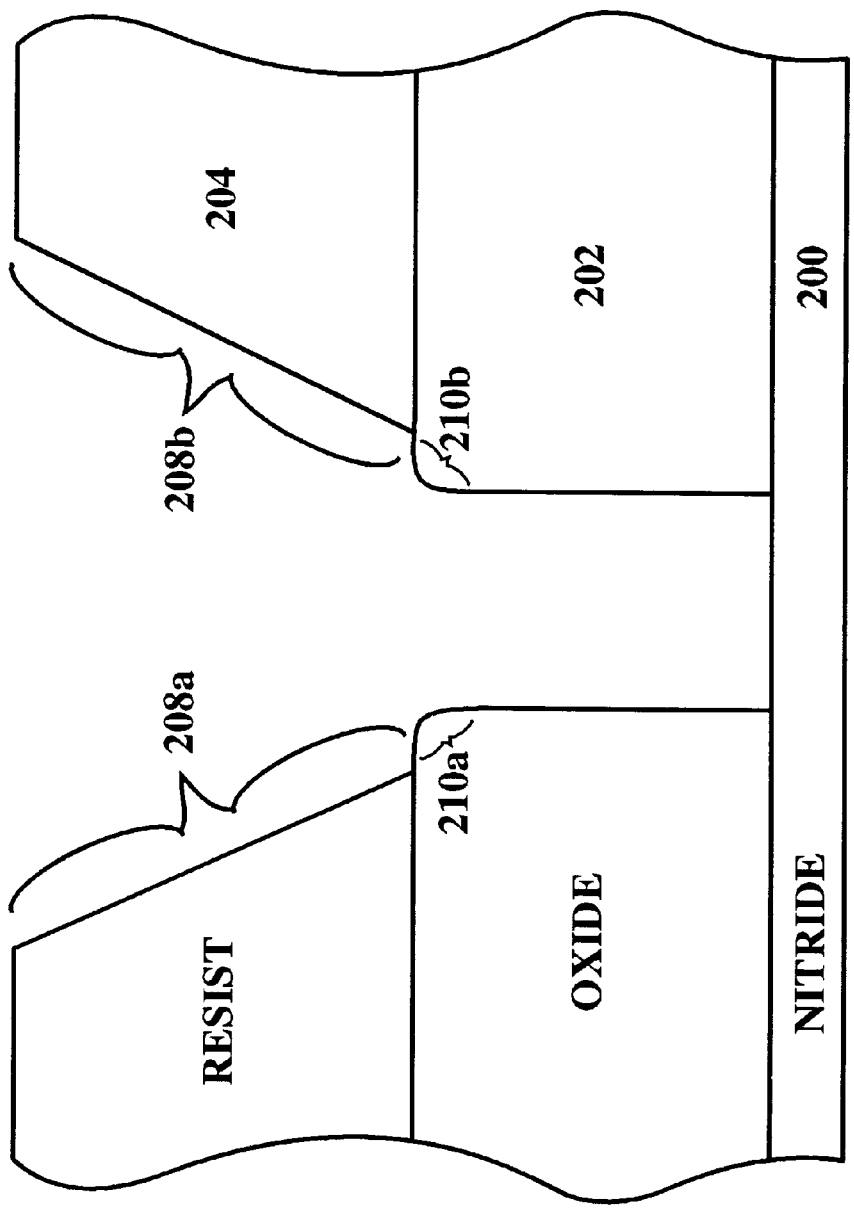
FIG. 2B is a cross-sectional view illustrating a second step associated with the formation of a contact opening having a smoothly rounded upper edge in accordance with the present claimed invention.

Referring next to FIG. 2B, after the formation of the opening extending to the top surface of nitride layer 200, nitride layer 200 is etched away to provide a contact opening at area 206. As shown in FIG. 2B, the contact opening extends completely through both oxide layer 202 and nitride layer 200. In the present embodiment, the present invention achieves an nitride-to-oxide selectivity of approximately 7 to 1, and a photoresist-to-nitride selectivity of approximately 2 to 1. More specifically, the present invention utilizes a gas chemistry comprising approximately 5 sccm of $CHF_3$, and approximately 45 sccm of $O_2$. Although such specific gas flow rates and ratios are recited in the present embodiment, the present invention is well suited to varying these flow rates/ratios as long as the nitride/photoresist selective conditions of the present invention remain in effect.

Referring still to FIG. 2B, in the present embodiment, the etch environment has wafer area pressure of approximately 200 mTorr, a chamber pressure of approximately 200 mTorr, a top electrode power of approximately 200 Watts, a bottom electrode power of approximately 100 Watts, a top electrode temperature of approximately 40 degrees Celsius, a bottom electrode temperature of approximately 40 degrees Celsius, and a wafer-to-top electrode gap of approximately 1.33 centimeters. Although such specific etching environment parameters are recited in the present embodiment, the present invention is well suited to varying these parameters as long as the nitride/photoresist selective conditions of the present invention remain in effect.

As shown in FIG. 2B, the nitride etch step of the present invention also etches portions, typically shown as 208a and 208b, of photoresist layer 204. In the present invention, the high ion energy used during the etching process causes photoresist layer 204 to become faceted (i.e. to form receded angled edges due to sputtering) at regions 208a and 208b. During the etching of nitride layer 200, the angled edges 208a and 208b of photoresist layer 204 recede and expose underlying oxide layer 202 at the edge (e.g. regions 210a and 210b) of the opening formed through oxide layer 202. Thus, the present invention smoothly rounds the corner regions 210a and 210b of oxide layer 202. As a result, the present invention enhances the ability of subsequently deposited material such as, for example, CVD tungsten to adhere to oxide layer 202, and to deposit metal reliably and evenly, and to uniformly fill the contact opening. Hence, the present invention eliminates defects associated with prior art contact opening formation methods and, thereby, improves yield and performance in manufactured semiconductor devices. As yet another advantage, the present invention achieves the above accomplishments without substantially deviating from existing semiconductor manufacturing steps and processes.

Figure 2C:
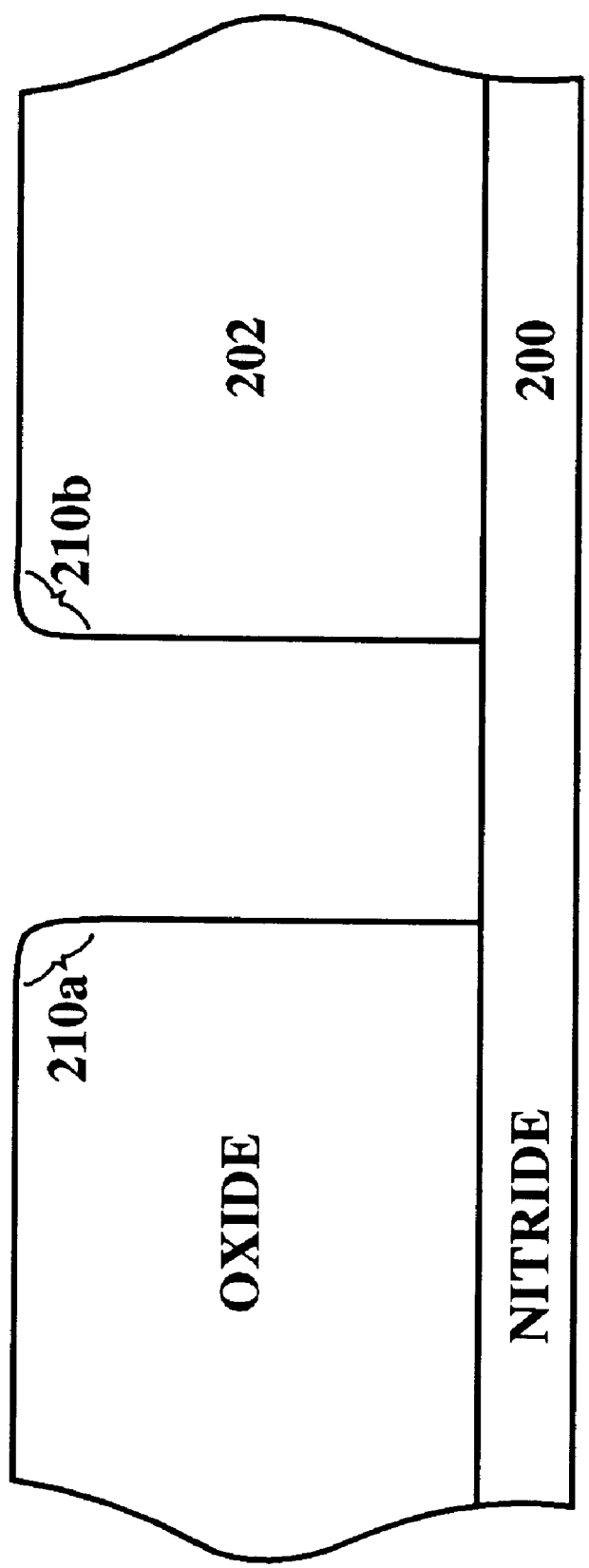
FIG. 2C is a cross-sectional view illustrating a third step associated with the formation of a contact opening having a smoothly rounded upper edge in accordance with the present claimed invention.

With reference now to FIG. 2C, a cross-sectional view illustrating the contact opening formed according to the present invention is shown after layer of photoresist 202 has been removed. As shown in FIG. 2C, the present invention achieves a contact opening having a rounded top edge (see e.g. portions 210*a* and 210*b*).

Figure 2D:
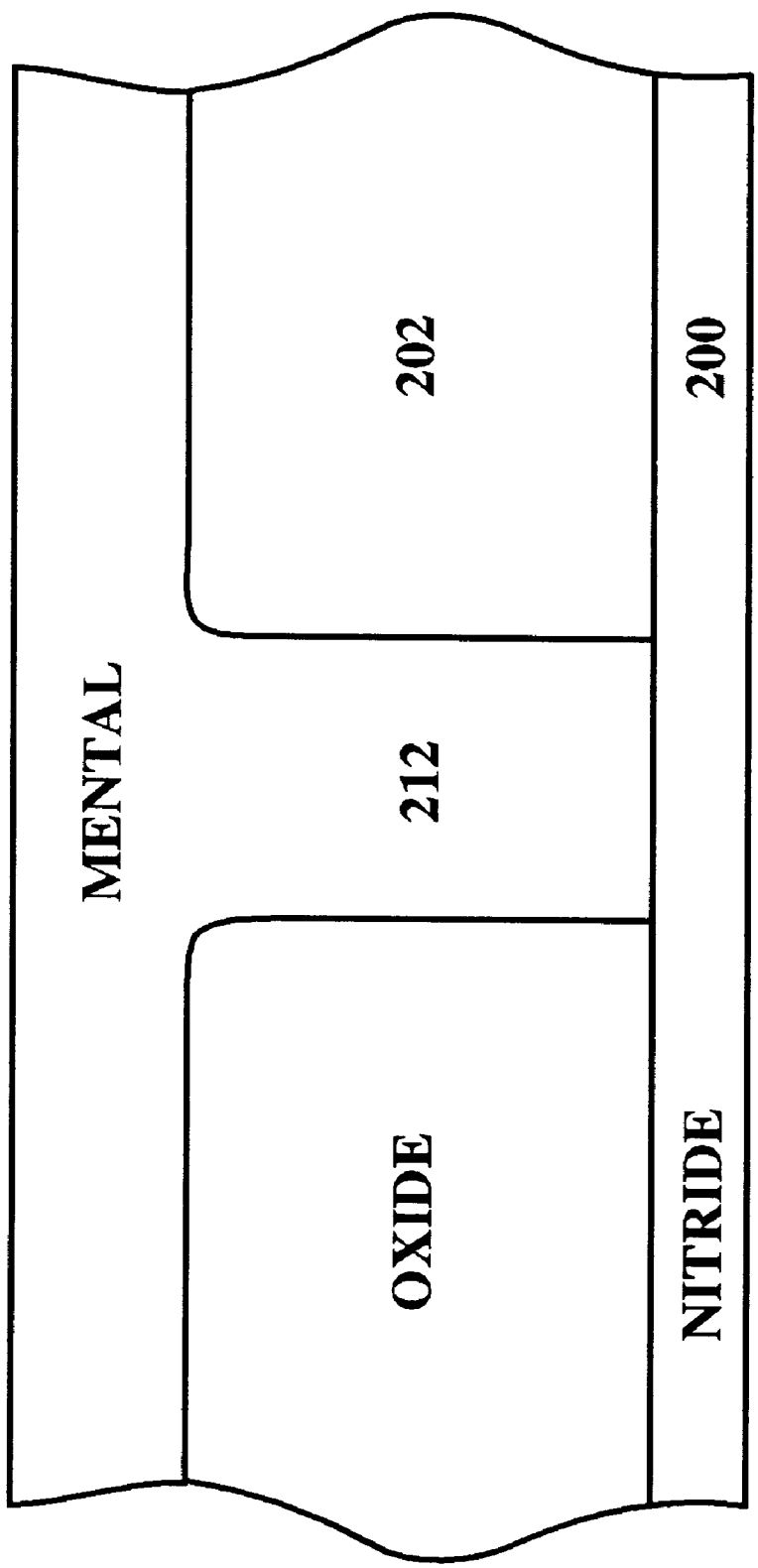
FIG. 2D is a cross-sectional view illustrating a fourth step associated with the formation of a contact opening having a smoothly rounded upper edge in accordance with the present claimed invention.

With reference now to FIG. 2D, a cross-sectional view illustrating the contact opening formed according to the present invention is shown. In FIG. 2D, layer of photoresist 202 has been removed, and after a layer of metal 212 has been deposited over oxide layer 202 and into the contact opening. As shown in FIG. 2D, the present invention achieves a smooth and uniform adhesion between the contact opening and metal layer 212.

Thus, the present invention provides a method for forming a contact opening wherein the method provides for selective etching of a desired material. The present invention further provides a method for forming a contact opening wherein the method does not required substantial deviation from existing semiconductor manufacturing steps and processes. Additionally, the present invention provides a method for forming a contact opening wherein the contact opening is ideally shaped for subsequent processing.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A self-aligned contact etch method for forming a contact opening having a rounded top corner profile, said self-aligned contact etch method comprising the steps of:

a) performing an oxide selective etch to form an opening extending from a top surface of a photoresist layer, through an underlying oxide layer, and terminating at a top surface of a nitride layer underlying said oxide layer; and b) performing a nitride selective etch to extend said opening through said nitride layer to an underlying contact layer, said nitride selective etch causing said photoresist layer to be etched, said nitride selective etch further causing said oxide layer to be etched at and near said opening at the interface between said photoresist layer and said oxide layer such that said opening is rounded at the top edge thereof when said layer of photoresist is removed.

2. The self-aligned contact etch method as recited in claim 1 wherein step a) comprises the step of:

removing said layer of photoresist disposed above said oxide layer after said oxide selective etch terminating at a top surface of a nitride layer has been performed.

3. The self-aligned contact etch method as recited in claim 1 wherein step a) comprises the step of:

performing an oxide selective etch having an oxide-to-nitride selectivity of approximately 100 to 1.

4. The self-aligned contact etch method as recited in claim 1 wherein step a) comprises the step of:

performing an oxide selective etch having an oxide-to-photoresist selectivity of approximately 15 to 1.

5. The self-aligned contact etch method as recited in claim 1 wherein step b) comprises the step of:

performing a nitride selective etch having a nitride-to-oxide selectivity of approximately 7 to 1.

6. The self-aligned contact etch method as recited in claim 1 wherein step b) comprises the step of:

performing a nitride selective etch having a photoresist-to-nitride selectivity of approximately 2 to 1.

7. A contact opening having a rounded top corner profile, said contact opening formed by performing the following steps:

a) creating an initial opening extending from a top surface of a photoresist layer, through an underlying oxide layer, and terminating at a top surface of a nitride layer underlying said oxide layer; and b) extending said initial opening through said nitride layer to an underlying contact layer, said initial opening extended using a nitride selective etch, said nitride selective etch causing said photoresist layer to be etched/receded, said nitride selective etch further causing said oxide layer to be etched at and near said opening at the interface between said photoresist layer and said oxide layer such that said opening is rounded at the top edge thereof when said layer of photoresist is removed.

8. The contact opening as recited in claim 7 wherein said step of creating an initial opening further comprises:

performing an oxide selective etch to form said initial opening.

9. The contact opening as recited in claim 8 wherein step a) comprises the step of:

removing said layer of photoresist disposed above said oxide layer after said oxide selective etch terminating at a top surface of a nitride layer has been performed.

10. The contact opening as recited in claim 8 wherein step a) comprises the step of:

performing an oxide selective etch having an oxide-to-nitride selectivity of approximately 100 to 1.

11. The contact opening as recited in claim 8 wherein step a) comprises the step of:

performing an oxide selective etch having an oxide-to-photoresist selectivity of approximately 15 to 1.

12. The contact opening as recited in claim 7 wherein step b) comprises the step of:

performing a nitride selective etch having a nitride-to-oxide selectivity of approximately 7 to 1.

13. The contact opening as recited in claim 7 wherein step b) comprises the step of:

performing a nitride selective etch having a photoresist-to-nitride selectivity of approximately 2 to 1.

14. A self-aligned contact etch method for forming a contact opening having a rounded top corner profile, said self-aligned contact etch method comprising the steps of:

a) performing an oxide selective etch having an oxide-to-nitride selectivity of approximately 100 to 1 and an oxide-to-photoresist selectivity of approximately 15 to 1 to form an opening extending from a top surface of a photoresist layer, through an underlying oxide layer, and terminating at a top surface of a nitride layer underlying said oxide layer; and b) performing a nitride selective etch having a nitride-to-oxide selectivity of approximately 7 to 1 and a photoresist-to-nitride selectivity of approximately 2 to 1 to extend said opening through said nitride layer to an underlying contact layer, said nitride selective etch causing said photoresist layer to be etched, said nitride selective etch further causing said oxide layer to be etched at and near said opening at the interface between said photoresist layer and said oxide layer such that said opening is rounded at the top edge thereof when said layer of photoresist is removed.

15. The self-aligned contact etch method as recited in claim 14 wherein step a) comprises the step of:

removing said layer of photoresist disposed above said oxide layer after said oxide selective etch terminating at a top surface of a nitride layer has been performed.

\* \* \* \* \*